(12) United States Patent
Yakabe et al.

(10) Patent No.: US 7,046,016 B2
(45) Date of Patent: May 16, 2006

(54) POTENTIAL FIXING DEVICE, POTENTIAL FIXING METHOD, AND CAPACITANCE MEASURING INSTRUMENT

(75) Inventors: Masami Yakabe, Tokyo (JP); Koichi Nakano, Hyogo (JP)

(73) Assignees: Tokyo Electron Limited, Tokyo (JP); Hokuto Electronics, Inc., Hyogo (JP)

( * ) Notice: Subject to any disclaimer, the term of this patent is extended or adjusted under 35 U.S.C. 154(b) by 0 days.

(21) Appl. No.: 10/509,624

(22) PCT Filed: Oct. 22, 2002

(86) PCT No.: PCT/JP02/10910

§ 371 (c)(1),
(2), (4) Date: Sep. 29, 2004

(87) PCT Pub. No.: WO2004/038434

PCT Pub. Date: May 6, 2004

(65) Prior Publication Data

US 2005/0116700 A1    Jun. 2, 2005

(51) Int. Cl.
*G01R 27/26* (2006.01)
(52) U.S. Cl. ....................... 324/658; 324/678
(58) Field of Classification Search ............... 324/658, 324/649, 600, 519, 548, 686, 72, 76.66, 76.11, 324/158.1, 661, 678; 320/166; 323/364, 323/369, 370
See application file for complete search history.

(56) References Cited

U.S. PATENT DOCUMENTS

| | | | | |
|---|---|---|---|---|
| 3,644,751 A * | 2/1972 | Spaid | .......................... | 327/132 |
| 5,012,237 A * | 4/1991 | Rosswurm | ............. | 340/870.37 |
| 5,028,876 A * | 7/1991 | Cadwell | ....................... | 324/678 |
| 5,659,254 A * | 8/1997 | Matsumoto et al. | ........ | 324/678 |
| 6,067,113 A * | 5/2000 | Hurwitz et al. | ............. | 348/241 |
| 6,331,765 B1 * | 12/2001 | Yamamoto et al. | ......... | 323/210 |
| 6,340,902 B1 * | 1/2002 | Kato | ........................... | 327/77 |
| 6,356,085 B1 * | 3/2002 | Ryat et al. | ................... | 324/658 |
| 6,362,632 B1 * | 3/2002 | Livingston | ................... | 324/661 |

* cited by examiner

*Primary Examiner*—Anjan Deb
*Assistant Examiner*—Hoai-An D. Nguyen
(74) *Attorney, Agent, or Firm*—Finnegan, Henderson, Farabow, Garrett & Dunner, L.L.P.

(57) ABSTRACT

An electric potential fixing apparatus is provided that can prevent the combined total amount of electricity of a connection line between the first capacitance and the second capacitance from changing even when the electric potential of the connection line between the first capacitance and the second capacitance is fixed in the case where the first capacitance and the second capacitance are directly connected.

This electric potential fixing apparatus has the first high resistance (3) and the second high resistance (4) and includes a voltage supply circuit (1) that preserves the combined total amount of electric charge of a measuring capacitance (14) and a fixed capacitance (15) and maintains constant the electric potential of a signal line (17) that connects the measuring capacitance (14) and the fixed capacitance (15). And an output terminal (5) of the voltage supply circuit (1) is connected to the signal line (17).

9 Claims, 4 Drawing Sheets

POTENTIAL FIXING DEVICE, POTENTIAL FIXING METHOD, AND CAPACITANCE MEASURING INSTRUMENT

This application is the National Stage International Application No. PCT/JP02/10910, filed on Oct. 22, 2002.

TECHNICAL FIELD

The present invention relates to an electric potential fixing apparatus, an electric potential fixing method and a capacitance measurement apparatus and particularly to the electric potential fixing apparatus and the electric potential fixing method to fix electric potential of a connection line between the first capacitance and the second capacitance and the capacitance measurement apparatus that includes such an electric potential fixing apparatus.

BACKGROUND ART

Conventionally, a capacitance measurement apparatus that measures a capacitance such as a capacitor microphone whose value of electrostatic capacitance changes for various frequencies is known. FIG. 6 is a circuit diagram showing an example of a conventional capacitance measurement apparatus. As shown in FIG. 6, the conventional capacitance measurement apparatus includes an operational amplifier 112, an AC voltage generation apparatus 113, a measuring capacitance 114 and feedback resistance 116 as feedback impedance. The feedback resistance 116 and the measuring capacitance 114 are connected via a signal line 117. The signal line 117 is connected to one terminal of the operational amplifier 112. Additionally, one terminal of the AC voltage generation apparatus 113 is connected to the electrode of the measuring capacitance 114 opposite to the side connected to the signal line 117. Additionally, the other terminal of the AC voltage generation apparatus 113 is grounded.

Here, the measuring capacitance 114 changes its own electrostatic capacitance Cs in response to received physical quantity (such as acceleration, pressures, gas, light and sound wave). Additionally, the AC voltage generation apparatus 113 is to generate an operation signal Vin that is applied to the measuring capacitance at the time of measuring the capacitance.

As a capacitance measurement action of the conventional capacitance measurement apparatus shown in FIG. 6, when the operation signal (voltage: Vin) is generated from the AC voltage generation apparatus 113, the voltage Vin of the operation signal is applied to both terminals of the measuring capacitance 114. Hereby, electric current flows to the measuring capacitance 114. In this case, since input impedance of the operational amplifier 112 is ideally infinite, all the electric current that flows to the measuring capacitance 114 flows to the feedback resistance 116. Hereby, it is possible to output the output voltage Vout corresponding to electrostatic capacitance Cs from a signal output terminal 118. Then, the electrostatic capacitance Cs can be obtained by performing various kinds of signal processing based on the output voltage Vout of a detection signal.

Since the conventional capacitance measurement apparatus shown in FIG. 6 uses the feedback resistance 116 as the feedback impedance, the output voltage Vout of the signal output terminal 118 has a frequency characteristic as represented by the following equation (1).

$$Vout = -Rf\{(Cd + \Delta C \cdot \sin\omega_c t) \cdot \omega_{in} \cdot \cos\omega_{in} t + \Delta C \cdot \omega_c \cdot \cos\omega_c t \cdot \sin\omega_{in} t\} Vi \quad (1)$$

Referring to the above equation (1), Vi is an amplitude of the signal Vin from the AC voltage generation apparatus 113 and $\omega_{in}$ is angular velocity. Additionally, Cd is a standard capacitance value of the measuring capacitance 114; $\Delta C$ and $\omega_c$ are a capacitance value and angular velocity of a capacitance changing part in the measuring capacitance 144, respectively. The above equation (1) includes a term in which the angular velocity $\omega_c$ of the capacitance changing part is proportionate to the capacitance value $\Delta C$ of the capacitance changing part. Because of this, since the output voltage Vout is proportionate to the frequency ($\omega_c/2\pi=fc$) of the capacitance changing part, the output voltage Vout has the frequency characteristic. Consequently, it is necessary to set up newly a processing circuit that does not have the frequency characteristic in a subsequent stage, and therefore there is a problem that the size of the circuit becomes large.

There, technology that the feedback impedance is configured not by the resistance but by the capacitance is proposed. FIG. 7 is a circuit diagram showing such a capacitance measurement apparatus. Referring to FIG. 7, this capacitance measurement apparatus is configured by a feedback capacitance 115. The output voltage Vout of this circuit is represented by the following equation (2).

$$Vout = \{(Cd + \Delta C \cdot \sin \omega_c t)/Cf\} Vin \quad (2)$$

As shown in the above equation (2), when the feedback impedance is configured by the feedback capacitance 115 (capacitance value: Cf), since the electric charge stored in the electrostatic capacitance Cs and that stored in the capacitance value Cf of the feedback capacitance 115 are equal, it is possible to maintain the amount of electric charge of the signal line 117 constantly. Consequently, the output voltage Vout does not include a term that is proportionate to the angular velocity $\omega_c$. Therefore, since the circuit output does not have dependence on the capacitance change frequency, there is no need to set up newly the processing circuit that does not have the frequency characteristic in a subsequent stage. As a result, it is possible to prevent the size of the circuit from becoming larger.

However, if the feedback impedance is configured by the feedback capacitance 115 as the technology shown in FIG. 7, since the direct current does not flow to the signal line 117 situated between the feedback capacitance 115 and the measuring capacitance 114, the signal line 117 becomes floating state electrically. For this reason, the electric potential of the signal line 117 becomes unstable and there is a disadvantage that the circuit does not operate normally such as the circuit output being saturated with the power voltage.

To prevent such a disadvantage, as shown in FIG. 7, it is conceivable to fix the electric potential of the signal line 117 by connecting resistance 119 between the signal line 117 and GND.

However, as is described above, in the case of fixing the electric potential by the resistance 119, at the time of measuring the capacitance, electric current may flow through the resistance 119. In that case, since the amount of electric charge varies, there is a problem that the sensibility of the capacitance measurement apparatus decreases. Therefore, it is difficult to execute an accurate capacitance measurement.

Additionally, when Vin is applied to the measuring capacitance 114, even though the signal line 117 is covered by a shielding wire (not illustrated) and the shielding wire and the signal line 117 are made to be at the same electric potential by imaginary short and then the shielding wire and the signal line 117 are dropped on the GND, the signal line 117 does not become the GND in the real operational amplifier 112 and a little signal of Vin appears on the signal line 117. Therefore, since parasitic capacitance is generated between the shielding wire and the signal line 117, it is difficult to execute an accurate capacitance measurement because of an effect of the parasitic capacitance.

The present invention is done to solve the above-mentioned problems and it is an object of the present invention to provide an electric potential fixing apparatus that can prevent the amount of electric charge in the connection line between the first capacitance and the second capacitance from changing.

It is another object of the present invention to provide a capacitance measurement apparatus that can execute an accurate capacitance measurement without lowering the sensibility even when the electric potential of the connection line between the first capacitance and the second capacitance is fixed.

It is yet another object of the present invention to provide an electric potential fixing method for enabling to prevent the amount of electric charge in the connection line between the first capacitance and the second capacitance from changing.

DISCLOSURE OF INVENTION

An electric potential fixing apparatus in one aspect of the present invention is an electric potential fixing apparatus that fixes electric potential of a connection line connecting a first capacitance and a second capacitance connected directly to the first capacitance, the electric potential fixing apparatus comprising a voltage supply unit, having at least two high impedances, operable to maintain constantly electric potential of the connection line, holding a total amount of electric charge of the first capacitance and the second capacitance, wherein an output terminal of the voltage supply unit is connected to the connection line.

Note that the high impedance in the present invention can be realized by a reverse bias characteristic of diode and the off state of a transistor besides high resistance.

The electric potential fixing apparatus in the above one aspect can prevent the amount of electric charge between the first capacitance and the second capacitance from changing by establishing a voltage supply unit that maintains constantly the electric potential of the two capacitances, holding the combined total electric charge of the first capacitance and the second capacitance and by connecting an output terminal of the voltage supply unit to the connection line between the two capacitances. Additionally, by including at least two high impedances in the voltage supply unit, it is possible to prevent effectively part of the electric current that flows to the connection line between the two capacitances from flowing to the side of the voltage supply unit by the high impedances. This also can prevent the amount of the electric charge in the connection line between the first capacitance and the second capacitance from changing. In this way, since it is possible to prevent the amount of the electric charge in the connection line between the first capacitance and the second capacitance from changing, even when, for example, the electric charge in the connection line between the first capacitance and the second capacitance is fixed in the capacitance measurement apparatus, the sensibility of the capacitance measurement apparatus does not decrease. As a result, it is possible to execute an accurate capacitance measurement.

The electric potential fixing apparatus in the other aspect of the present invention is an electric potential fixing apparatus that fixes electric potential of a connection line connecting a first capacitance and a second capacitance connected directly to the first capacitance, the electric potential fixing apparatus comprising a voltage supply unit, having at least two high impedances, operable to output same electric potential as electric potential of an operation signal applied to the connection line, wherein an output terminal of the voltage supply unit is connected to the connection line.

The electric potential fixing apparatus in the above other aspect of the present invention can prevent the combined total amount of the electric charge of the connection line from changing because input and output of the electric current to and from the connection line between the first capacitance and the second capacitance is stopped by establishing a voltage supply unit that outputs the equal electric potential as the electric potential of an operation signal applied to the connection line that connects the first capacitance and the second capacitance and by connecting an output terminal of the voltage supply unit to the connection line between the first capacitance and the second capacitance. Additionally, by including at least two high impedances in the voltage supply unit, it is possible to prevent part of the electric current that flows to the connection line from flowing to the side of the voltage supply unit by the high impedances. This also prevents the combined total amount of electric charge of the connection line from changing. In this way, since it is possible to prevent the amount of the electric charge in the connection line between the first capacitance and the second capacitance from changing, even when, for example, the electric charge in the connection line between the first capacitance and the second capacitance is fixed in the capacitance measurement apparatus, the sensibility of the capacitance measurement apparatus does not decrease. As a result, it is possible to execute an accurate capacitance measurement.

In the electric potential fixing apparatus in the above one aspect or the other aspect, preferably, the voltage supply unit includes a first high resistance, a second high resistance connected directly to the first high resistance, and a voltage dividing unit that outputs electric potential divided by the first high resistance and the second high resistance.

Note that "high resistance" in the present invention is more than several MΩ when the target capacitance is about 1 pF and more than several hundreds of MHz and more than several hundreds of MΩ when the target capacitance is about 1 pF and about several hundreds of KHz to 1 MHz. In other words, "high resistance" means the resistance that has sufficiently large and relatively high resistance value compared with the impedance components of the first capacitance and the second capacitance. In this way, when the voltage supply unit is configured to include the voltage dividing unit that outputs the electric potential divided by the first high resistance and the second high resistance, it is possible to adjust easily the output electric potential of the voltage supply unit by selecting appropriately the resistance values of the first high resistance and the second high resistance.

In the electric potential fixing apparatus in the above one aspect or the other aspect, preferably, the voltage supply unit includes an amplifier, a predetermined voltage applying unit, a first high resistance, a second high resistance and the output terminal, one terminal of the first high resistance is connected to the amplifier, another terminal of the first high resistance and one terminal of the second high resistance are connected, the output terminal is connected between the other terminal of the first high resistance and the one terminal of the second high resistance, and another terminal of the second high resistance and the predetermined voltage applying unit are connected.

When configured like this, by deciding the amplitude of the amplifier, the resistance values of the first high resistance and the second high resistance and the voltage value of the predetermined voltage applying unit, it is possible to control easily the electric potential of the output terminal of the voltage supply unit to be same as the electric potential of an operation signal applied to the connection line between the first capacitance and the second capacitance.

In a capacitance measurement apparatus including the electric potential fixing apparatus in the further other aspect of the present invention, a capacitance measurement apparatus comprising the electric potential fixing apparatus, wherein the electric potential fixing apparatus further includes a first operational amplifier, the first capacitance is a measuring capacitance, the connection line between the two capacitances is a signal line and an input terminal of the first operational amplifier is connected to the signal line.

In the above capacitance measurement apparatus in the further other aspect, by configuring to include the electric potential fixing apparatus that has any one of the above-described configurations, by making the first capacitance of the electric potential a measuring capacitance and by making the connection line between the two capacitance a signal line, input and output of the electric current to and from the signal line is stopped and therefore it is possible to prevent the combined total amount of electric charge of the signal line from changing. Hereby, even when the electric potential of the signal line between the first capacitance that makes up the measuring capacitance and the second capacitance is fixed, the sensibility of the capacitance measurement apparatus does not decrease. As a result, it is possible to execute an accurate capacitance measurement.

In a capacitance measurement apparatus including the electric potential fixing apparatus in the above further other aspect of the present invention, preferably, the electric potential fixing apparatus further includes a second operation amplifier and an output terminal of the second operational amplifier is connected to the second capacitance. When configured like this, it is possible to use the second operational amplifier as the electric power.

The electric potential fixing method in another aspect of the present invention is an electric potential fixing method for fixing electric potential of a connection line between two capacitances, a first capacitance and a second capacitance connected directly to the first capacitance, wherein with electric potential divided using at least two high impedances as output electric potential, the output electric potential is applied to the connection line between the two capacitances and the output electric potential is fixed at output potential at which there is no input and output of electric current to and from the connection line.

According to the electric potential fixing method of the above other aspect, when the electric potential of the connection line between the two capacitances is fixed, by fixing the output electric potential applied to the connection line between the two capacitances at the output electric potential at which input and output of the electric current to and from the connection line is stopped, it is possible to prevent the combined total amount of electric charge from changing. Additionally, by fixing the electric potential by the output electric potential divided using at least two high impedances, it is possible by the high impedances to prevent effectively part of the electric current that flows to the connection line between the first capacitance and the second capacitance from flowing to the side of the high impedance. This can also prevents the combined total amount of the electric capacitance in the connection line between the first capacitance and the second capacitance from changing. In this way, since it is possible to prevent the combined total amount of the electric charge in the connection line between the first capacitance and the second capacitance from changing, even when, for example, the electric charge in the connection line between the first capacitance and the second capacitance is fixed in the capacitance measurement apparatus, the sensibility of the capacitance measurement apparatus does not decrease. As a result, it is possible to execute an accurate capacitance measurement.

The electric potential fixing method in further another aspect of the present invention is an electric potential fixing method for fixing electric potential of a connection line between a first capacitance and a second capacitance connected directly to the first capacitance, wherein with electric potential divided using at least two high impedances as output electric potential, the output electric potential is applied to a connection line between the two capacitances and the output electric potential is set up to be equal to electric potential of an operation signal applied to a connection line between the two capacitances.

In the electric potential fixing method in the above further other aspect, when fixing the electric potential of the connection line between the first capacitance and the second capacitance, by setting up the output electric potential applied to the connection line to be equal to the electric potential of the operation signal applied to the connection line between the two capacitances, it is possible to prevent the combined total amount of electric charge from changing. Additionally, by fixing the electric potential by the output electric potential divided using at least two high impedances, it is possible by the high impedances to prevent effectively part of the electric current that flows to the connection line from flowing to the side of the high impedance. This can also prevents the combined total amount of the electric charge in the connection line from changing. In this way, since it is possible to prevent the combined total amount of electric charge in the connection line between the two capacitances from changing, even when, for example, the electric charge in the connection line between the first capacitance and the second capacitance is fixed in the capacitance measurement apparatus, the sensibility of the capacitance measurement apparatus does not decrease. As a result, it is possible to execute an accurate capacitance measurement.

In the electric potential fixing method in the above one aspect and further another aspect, preferably, either the first capacitance or the second capacitance is used as a measuring capacitance. When configured like this, it is possible to execute easily a capacitance measurement.

BEST MODE FOR CARRYING OUT THE INVENTION

The embodiments of the present invention are explained below based on the figures.

THE FIRST EMBODIMENT

Figure 1:
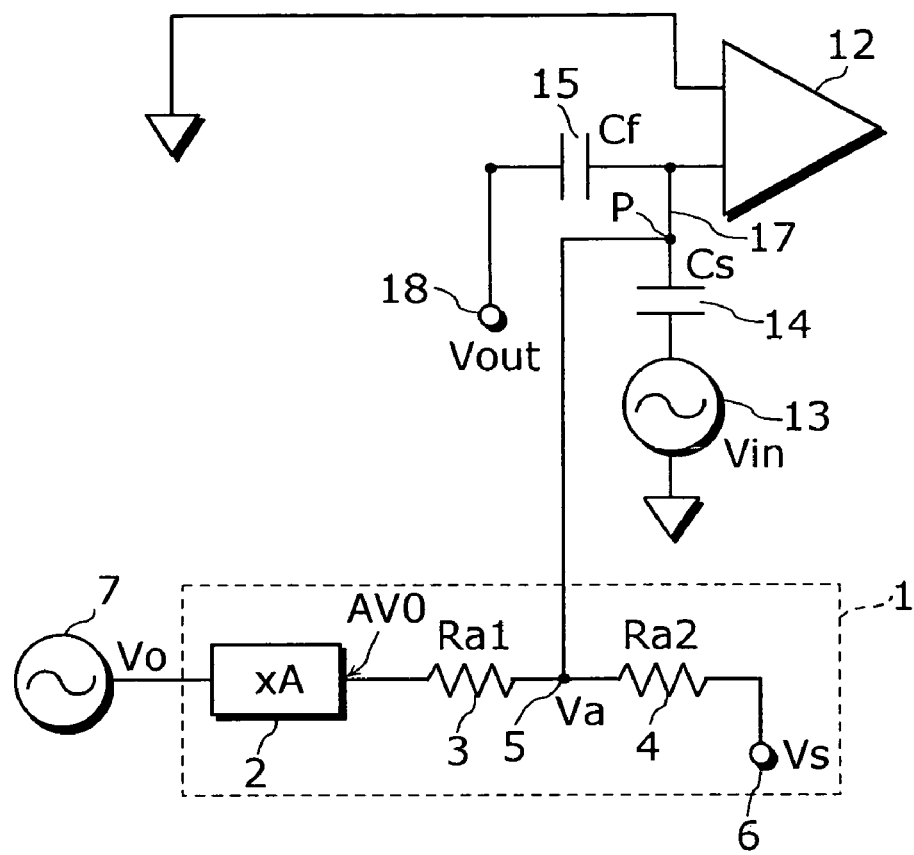
FIG. 1 is a circuit diagram showing a capacitance measurement apparatus including an electric potential fixing apparatus according to the first embodiment of the present invention.
Figure 2:
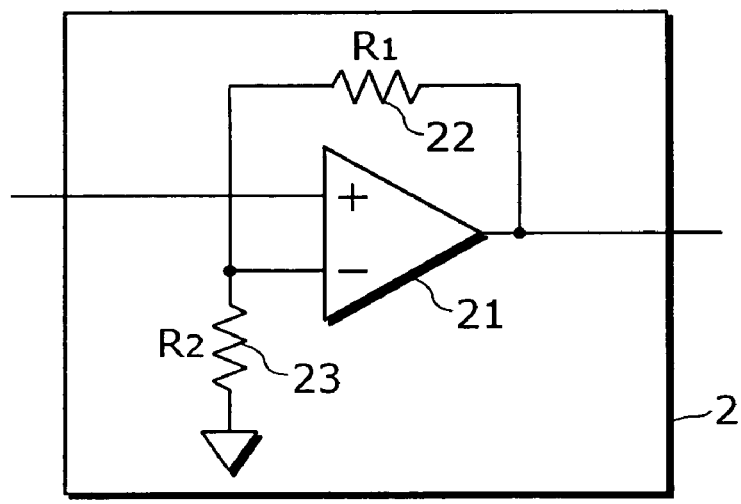
FIG. 2 is a circuit diagram showing an example of the internal configuration of an amplifier included in the electric potential fixing apparatus of the first embodiment shown in FIG. 1.

FIG. 1 is a circuit diagram showing a capacitance measurement apparatus including an electric potential fixing apparatus according to the first embodiment of the present invention. FIG. 2 is a circuit diagram showing an example of the internal configuration of an amplifier in the electric potential fixing apparatus of the first embodiment shown in FIG. 1.

First, the configuration of the capacitance measurement apparatus including the electric potential fixing apparatus according to the first embodiment is explained with reference to FIG. 1 and FIG. 2. The capacitance measurement apparatus of the first embodiment includes an operation amplifying circuit 12, an AC voltage generation apparatus 13, a measuring capacitance 14 which has an electrostatic capacitance Cs and a fixed capacitance 15, which has a capacitance value Cf, as feedback impedance. By the way, the operational amplifying circuit 12 is an example of "the first operational amplifier" of the present invention. Additionally, the measuring capacitance 14 is an example of "the first capacitance" or "the second capacitance" of the present invention and the fixed capacitance 15 is an example of "the first capacitance" or "the second capacitance" of the present invention.

The measuring capacitance 14 and the fixed capacitance 15 are connected via a signal line 17. The signal line 17 is connected to one terminal of the operation amplifying circuit 12. By the way, the signal line 17 is an example of "a connection line" of the present invention. Additionally, one terminal of the AC voltage generation apparatus 13 is connected to the opposite electrode of the measuring capacitance 14 to the side connected to the signal line 17. Additionally, a signal output terminal 18 is connected to the electrode of the fixed capacitance 15 opposite to the side connected to the signal line 17. Additionally, the other terminal of the AC voltage generation apparatus 13 is grounded in the present embodiment but may be connected to the DC component. By the way, the measuring capacitance 14 changes its own electrostatic capacitance Cs in response to received physical quantity (such as acceleration, pressures, gas, light and sound wave). Additionally, the AC voltage generation apparatus 13 is to generate an operation signal Vin that is applied to the measuring capacitance at the time of measuring the capacitance.

Here, in the capacitance measurement apparatus of the first embodiment, the electric potential of the signal line 17 is fixed using the electric potential fixing apparatus equipped with a voltage supply circuit 1. Note that the voltage supply circuit 1 is an example of "a voltage supply means" of the present invention. The voltage supply circuit 1 includes an amplifier 2 that has an amplitude A, the first high resistance 3 that has a resistance value of Ra1 and the second high resistance 4 that has a resistance value of Ra2. Ra1 of the first high resistance 3 and Ra2 of the second high resistance both have a resistance value of more than 1 MΩ. It is acceptable if these resistance values are the resistance values that have relatively sufficiently high values compared with an approximate characteristic impedance value obtained by the frequency and the detected capacitance used together.

Additionally, to the input side of the amplifier 2 is connected a different AC voltage generator (another power) 7 from the AC voltage generator 13. To the output side of the amplifier 2 is connected one terminal of the first high resistance 3. Between the other terminal of the first high resistance 3 and one terminal of the second high resistance 4 is connected an output terminal 5. The output terminal 5 of the voltage supply circuit 1 is connected to the signal line 17 at the point P. A terminal 6 is set up to the other terminal of the second high resistance 4. To the terminal 6 is applied the predetermined electric potential Vs. This terminal 6 is an example of "the predetermined voltage applying means". Additionally, from the output terminal 5 is outputted Voltage Va divided by the resistance partition of the first high resistance 3 and the second high resistance 4.

Additionally, the amplifier 2, for example, has a configuration shown in FIG. 2. Namely, the amplifier 2 includes an operational amplifying circuit 21, a resistance 22 that has a resistance value of R1, and a resistance 23 that has a resistance value of R2. To the non-inverting input terminal of the operational amplifying circuit 21 is connected the AC voltage generator 7 (refer to FIG. 1). Additionally, between the output terminal and the non-inverting input terminal of the operational amplifying circuit 21 is connected the resistance 22. Additionally, between the non-inverting input terminal of the operational amplifying circuit 21 and GND is connected the resistance 23. When configured like this, it is possible to obtain easily the amplifier 2 that has an amplitude A=(R1+R2)/R2.

As for the electric potential fixing method of the capacitance measuring apparatus according to the first embodiment, the amplitude A of the amplifier 2, the resistance Ra1 of the first high resistance 3, the resistance Ra2 of the second high resistance 4 and the voltage Vs of the terminal 6 are decided in order that the voltage Vin of the operation signal that flows through the signal line 17 becomes equal to the voltage Va of the output terminal 5 of the voltage supply circuit 1. By the way, the amplitude A of the amplifier 2 is easily adjustable by appropriately selecting the resistance values R1 and R2 of the resistance 22 and 23 shown in FIG. 2.

As for the capacitance measurement operation of the capacitance measurement apparatus of the first embodiment shown in FIG. 1, when the operation signal (voltage: Vin) is generated from the AC voltage generation apparatus 13, the voltage Vin of the operation signal is applied to the both terminals of the measuring capacitance 14. Hereby, the current flows to the measuring capacitance 14. In this case, the input impedance of the operational amplifier 12 is ideally infinite, all the current that flows to the measuring capacitance 14 flows to the fixed capacitance 15. Hereby, the output voltage Vout corresponding to the electrostatic capacitance Cs is outputted from the signal output terminal 18. Then, by performing various kinds of signal processing based on the output voltage Vout of the detection signal, it is possible to obtain the electrostatic capacitance Cs of the measuring capacitance 14.

In the first embodiment, as is described above, by establishing the voltage supply circuit 1 that applies the alternating current in order to fix the electric potential to the signal line 17 that connects the measuring capacitance 14 and the fixed capacitance 15 and setting up the electric potential of the output terminal 5 of the voltage supply circuit 1 to be equal to the electric potential Vin of the operation signal applied to the signal line 17, input and output of the electric current to and from the signal line 17 is stopped and therefore it is possible to prevent the amount of electric charge of the signal line 17 from changing.

Additionally, by including high impedance of the first high resistance 3 and the second high resistance 4, it is possible by the high impedance to effectively prevent part of the electric current that flows through the signal line 17 from flowing into the voltage supply circuit 1. This also can prevent the amount of electric charge of the signal line 17 from changing.

In the first embodiment, as is described above, since there is no input and output of the electric charge to and from the signal line 17, it is possible to prevent the combined total amount of electric charge of the signal line 17 from changing.

Here, the combined total amount of electric charge of the measuring capacitance 14 and the fixed capacitance 15 is explained. As is shown in FIG. 1, since the operation signal (voltage: Vin) from the AC voltage generation unit 13 is constant, the voltage Vs applied to the measuring voltage 14 is also constant. However, since the measuring capacitance 14 is a capacitance detection unit, the capacitance value Cs of the measuring capacitance 14 changes. The change in capacitance value Cs of the measuring capacitance 14 becomes the change in the amount of electric charge Qs of the measuring capacitance 14. In the first embodiment, as is described above, since there is no input and output of the electric charge to and from the signal line 17, the addition of the amount of electric charge Qf accumulated in the fixed capacitance 15 and the amount of electric charge Qs accumulated in the measuring capacitance 14 is constant. Therefore, increase and decrease of the amount of electric charge Qs of the measuring capacitance 14 appears as decrease and increase of the amount of electric charge Qf of the fixed capacitance 15.

The change (the decrease and increase) in the amount of electric charge Qf of the fixed capacitance appears as the change (the decrease and increase) in the voltage value Vf applied to the fixed capacitance 15 because the capacitance value Cf of the fixed capacitance 15 is constant. Then, the output of the voltage value Vf applied to the fixed capacitance 15 is outputted as Vout from the signal output terminal 18.

In other words, in the capacitance measurement apparatus of the first embodiment, there is exchange of electric charge between the capacitance value Cs of the measuring capacitance 14 and the capacitance value Cf of the fixed capacitance 15 but there is no input and output of the electric charge to and from the signal line 17 and therefore the combined total amount of the electric charge of the measuring capacitance 14 and the fixed capacitance 15 is constant. Hereby, the combined total amount of electric charge of the measuring capacitance 14 and the fixed capacitance remains constant and the fixed electric potential is supplied to the signal line 17 by the voltage supply circuit 1. Therefore, even in the case of fixing the electric potential of the signal line 17 that connects the measuring capacitance 14 and the fixed capacitance 15, the sensibility of the capacitance measurement apparatus does not decrease. As a result, it is possible to execute an accurate capacitance measurement.

THE SECOND EMBODIMENT

Figure 3:
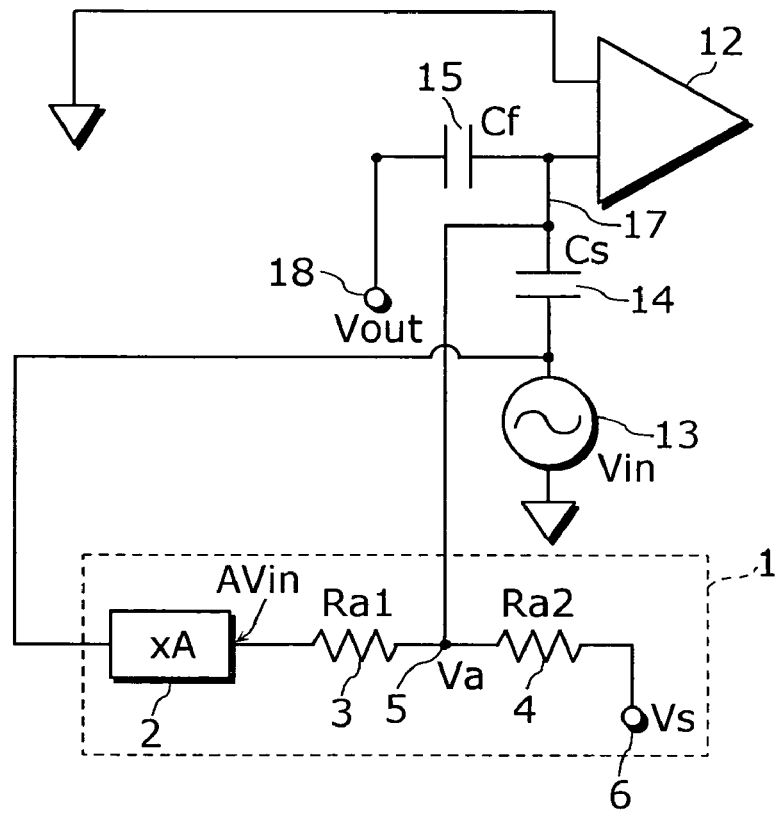
FIG. 3 is a circuit diagram showing a capacitance measurement apparatus including an electric potential fixing apparatus according to the second embodiment of the present invention.

FIG. 3 is a circuit diagram showing the capacitance measurement apparatus equipped with the electric potential fixing apparatus including the voltage division circuit according to the second embodiment of the present invention. Referring to FIG. 3, the voltage supply circuit 1 of the second embodiment shows an example that the AC voltage generation apparatus 13, which applies the operation signal Vin to the signal line 17, is connected to the input side of the amplifier 2, instead of the AC voltage generation apparatus 7, in the configuration of the above-described first embodiment. By the way, the other configuration than the second embodiment is same as that of the above-described first embodiment.

In the second embodiment, as is described above, by connecting the AC voltage generation apparatus 13 that applies the operation signal Vin to the signal line 17 to the input side of the amplifier 2, the AC voltage generation apparatus 7 can be omitted and therefore it is possible to simplify the circuit configuration compared with the first embodiment.

Additionally, in the second embodiment, similarly to the first embodiment, by adjusting the amplitude A of the amplifier 2, the resistance value Ra1 of the first high resistance 3, the resistance value Ra2 of the second high resistance 4 and the voltage Vs of the terminal 6, it can be easily set up the voltage Va of the output terminal 5 of the voltage supply circuit 1 to be equal to the voltage Vin of the operation signal of the signal line 17. To be more specific, it is possible to make the amplitude A of the amplifier 2 shown in FIG. 2 to be A=2 by making the resistance values of the resistance 22 and 23 to be R1=R2 and it is possible to make the voltage Va of the output terminal 5 of the voltage supply circuit 1 to be Va=Vin by making Vs=0V and Ra1=Ra2.

As is described, by setting up the voltage Va of the output terminal 5 of the voltage supply circuit 1 to be equal to the voltage Vin of the operation signal of the signal line 17, similarly to the first embodiment, since there is no input and output of the electric current to and from the signal line 17, it is possible to effectively prevent the combined total amount of electric current of the signal line 17 from changing. As a result, in the capacitance measurement apparatus, even in the case of fixing the electric potential of the signal line 17, since the sensibility of the capacitance measurement apparatus does not decrease, it is possible to execute an accurate capacitance measurement.

THE THIRD EMBODIMENT

Figure 4:
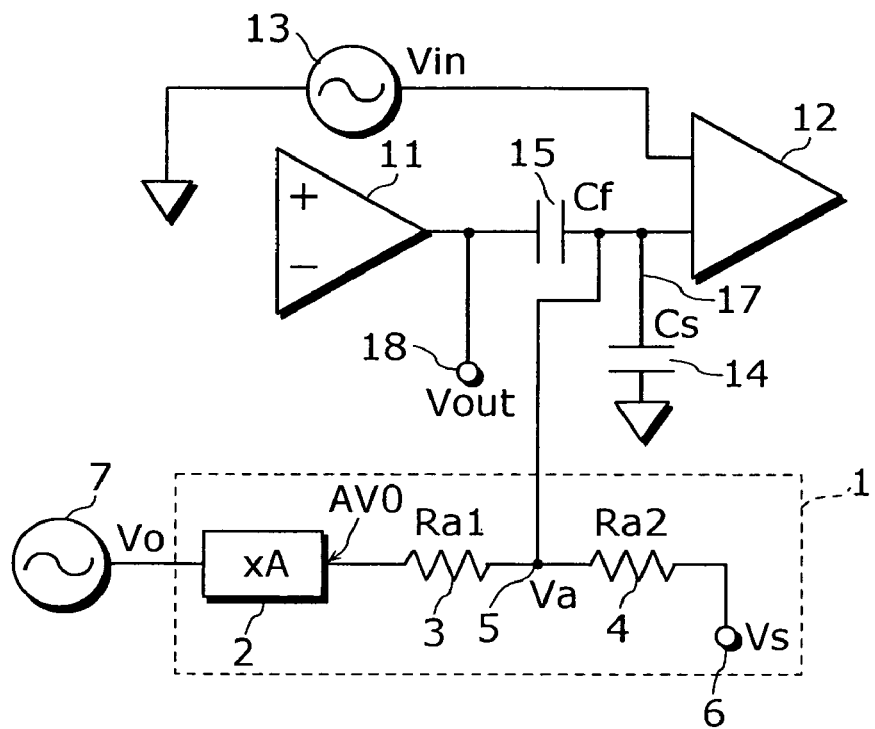
FIG. 4 is a circuit diagram showing a capacitance measurement apparatus including an electric potential fixing apparatus according to the third embodiment of the present invention.

FIG. 4 is a circuit diagram showing the capacitance measurement apparatus including the electric potential fixing apparatus according to the third embodiment of the present invention.

First, referring to FIG. 4, the configuration of the capacitance measurement apparatus including the electric potential fixing apparatus according to the third embodiment is explained. The capacitance measurement apparatus according to the third embodiment includes an operational amplifying circuit 11 that is a voltage generator, an operational amplifying circuit 12 in a state of imaginary short, an AC voltage generator 13, a measuring capacitance 14 and a fixed capacitance 15. By the way, the operational amplifying circuit 11 is an example of "the second operational amplifier". The measuring capacitance 14 and the fixed capacitance 15 are connected by a signal line 17. The signal line 17 is connected to one input terminal of the operational amplifying circuit 12. Additionally, the AC voltage generator 13 is connected to the other input terminal of the operational amplifying circuit 12.

Here, in the third embodiment, the electric potential of the signal line 17 is fixed using the electric potential fixing apparatus equipped with the voltage supply circuit 1. By the way, the configuration of the voltage supply circuit 1 and that of the amplifier 12 included in the voltage supply circuit 1 are similar to those of the first embodiment. In other words, the voltage supply circuit 1 includes the amplifier 2 that has the amplitude A, the first high resistance 3 and the second high resistance 4. Another AC voltage generator 7 than the AC voltage generator 13 is connected to the input side of the amplifier 2. One terminal of the first resistance 3 is connected to the output side of the amplifier 2. The output terminal 5 of the voltage supply circuit 1 is set up to the other terminal of the first high resistance 3. The output terminal 5 of the voltage supply circuit 1 is connected to the signal line 17. The terminal 6 is set up to the other terminal of the second high resistance 4. Predetermined electric potential Vs is applied to the terminal 6. Additionally, from the output terminal 5, the voltage Va divided by a resistance division by the first high resistance 3 and the second high resistance 4 is outputted.

As for the electric potential fixing method by the capacitance measurement apparatus according to the third embodiment, the amplitude A of the amplifier 2, the resistance value Ra1 of the first high resistance 3, the resistance value Ra2 of the second high resistance 4 and the voltage Vs of the terminal 6 are decided so that the voltage Vin of the operation signal that flows to the signal line 17 becomes equal to the voltage Va of the output terminal 5 of the voltage supply circuit 1.

As for the capacitance measurement operation of the capacitance measurement apparatus of the third embodiment shown in FIG. 4, since the operational amplifier 12 is in the state of imaginary short, the voltage Vin (the operation signal) from the AC voltage generation apparatus 13 is applied to the signal line 17. Hereby, the electric current flows to the both terminals of the measuring capacitance 14. Then, the output voltage Vout corresponding to the electrostatic capacitance Cs of the measuring capacitance 14 is outputted from the signal output terminal 18. By performing various kinds of signal processing to the output voltage Vout, the electrostatic capacitance Cs of the measuring capacitance 14 can be obtained.

In the third embodiment, as is described above, by establishing the voltage supply circuit 1 that applies the alternating current in order to fix the electric potential to the signal line 17 that connects the measuring capacitance 14 and the fixed capacitance 15 and setting up the electric potential of the output terminal 5 of the voltage supply circuit 1 to be equal to the electric potential Vin of the operation signal applied to the signal line 17, input and output of the electric current to and from the signal line 17 is stopped and therefore it is possible to prevent the amount of electric charge of the signal line 17 from changing. Additionally, by including high impedance of the first high resistance 3 and the second high resistance 4, it is possible by the high impedance to effectively prevent part of the electric current that flows through the signal line 17 from flowing into the voltage supply circuit 1. This also can prevent the amount of electric charge of the signal line 17 from changing. As a result, in the capacitance measurement apparatus according to the third embodiment, even in the case of fixing the electric potential of the signal line 17 that connects the measuring capacitance 14 and the fixed capacitance 15, since the sensibility of the capacitance measurement apparatus does not decrease, it is possible to execute an accurate capacitance measurement.

THE FOURTH EMBODIMENT

Figure 5:
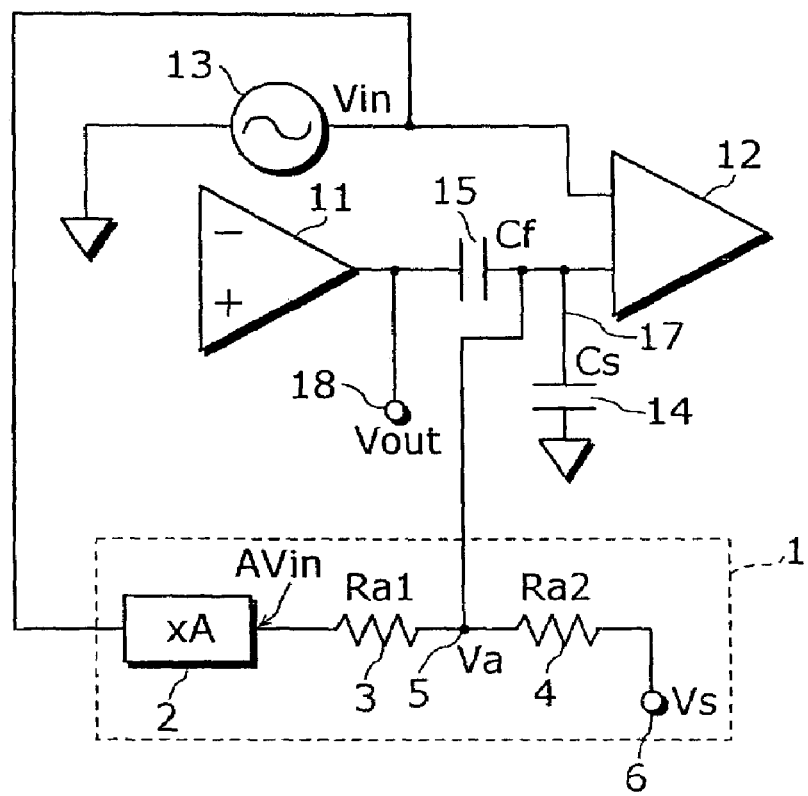
FIG. 5 is a circuit diagram showing a capacitance measurement apparatus including an electric potential fixing apparatus according to the fourth embodiment of the present invention.
Figure 6:
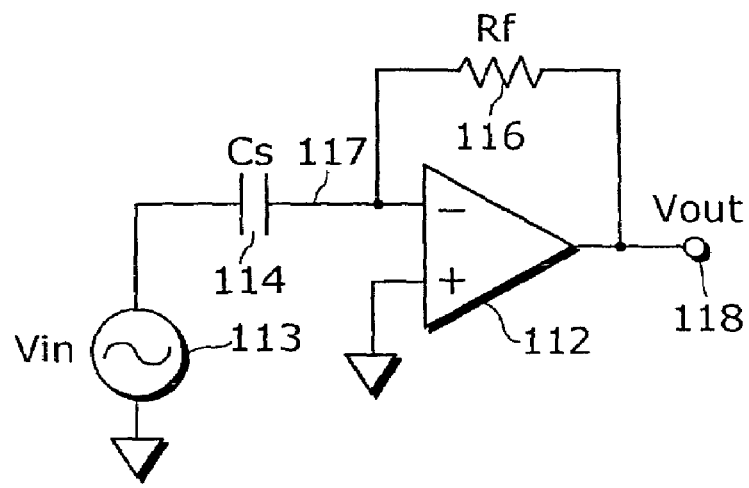
FIG. 6 is a circuit diagram showing a conventional capacitance measurement apparatus in the case where resistance is used as feedback impedance.
Figure 7:
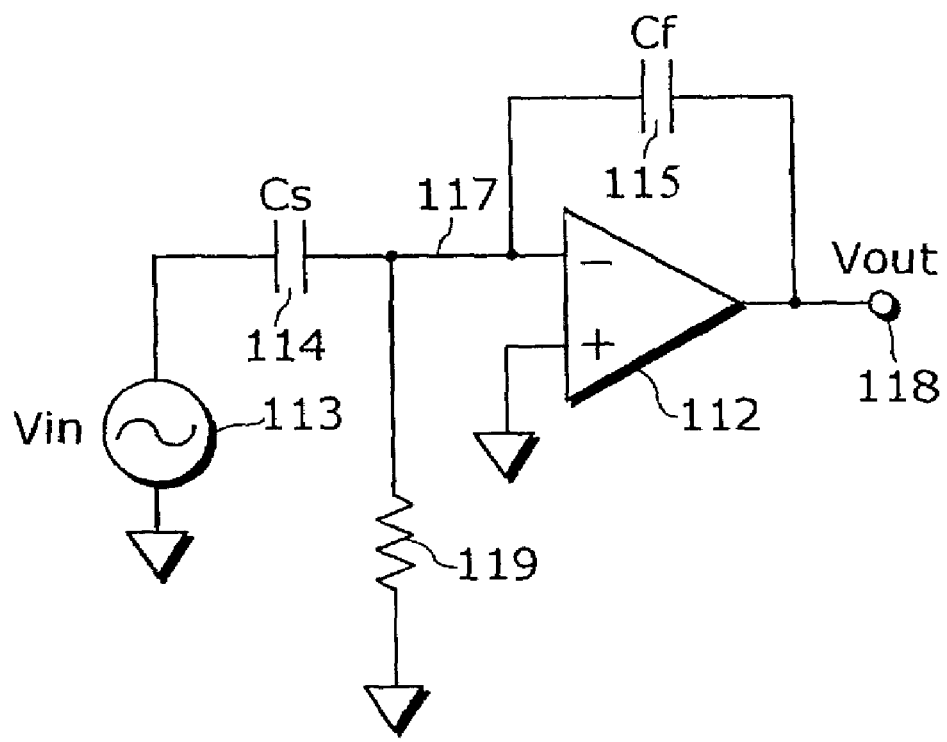
FIG. 7 is a circuit diagram showing a capacitance measurement apparatus in the case where capacitance is used as the feedback impedance in FIG. 6.

FIG. 5 is a circuit diagram showing the capacitance measurement apparatus equipped with the electric potential fixing apparatus including the voltage supply circuit according to the fourth embodiment. Referring to FIG. 5, the voltage supply circuit 1 of the fourth embodiment shows an example that the AC voltage generation apparatus 13, which applies the operation signal Vin to the signal line 17, is connected to the input side of the amplifier 2, instead of the AC voltage generation apparatus 7, in the configuration of the above-described third embodiment. By the way, the other configuration than the fourth embodiment is same as that of the third embodiment.

In the fourth embodiment, as is described above, by connecting the AC voltage generation apparatus 13 to apply the operation signal Vin to the signal line 17 to the input side of the amplifier 2, the AC voltage generation apparatus 7 can be omitted and therefore it is possible to simplify the circuit configuration compared with the third embodiment.

Additionally, in the fourth embodiment, similarly to the third embodiment, by adjusting the amplitude A of the amplifier 2, the resistance Ra1 of the first high resistance 3, the resistance Ra2 of the second high resistance 4 and the voltage Vs of the terminal 6, it can be easily set up the voltage Va of the output terminal 5 of the voltage supply circuit 1 to be equal to the voltage Vin of the operation signal of the signal line 17. To be more specific, it is possible to make the amplitude A of the amplifier 2 shown in FIG. 2 to be A=2 by making the resistance values of the resistance 22 and 23 to be R1=R2 and it is possible to easily make the voltage Va of the output terminal 5 of the voltage supply circuit 1 to be equal electric potential to the voltage Vin of the operation signal of the signal line 17.

As is described, by setting up the voltage Va of the output terminal 5 of the voltage supply circuit 1 to be equal to the voltage Vin of the operation signal of the signal line 17, similarly to the third embodiment, since there is no input and output of the electric current to and from the signal line 17, it is possible to effectively prevent the combined total amount of electric charge of the signal line 17 from changing. As a result, in the capacitance measurement apparatus, even in the case of fixing the electric potential of the signal line 17, since the sensibility of the capacitance measurement apparatus does not decrease, it is possible to execute an accurate capacitance measurement. For example, when Cs=20 pF, Cf=1 pF, the amplitude A of the amplifier=2 and Vin is an input of several tens of mVrms at 500 KHz, the voltage sensibility in Cs is −16 dB in the case of Ra1=Ra2=1 MΩ but −5 dB in the case of Ra1=Ra2=100 MΩ. Namely, an improvement of about 10 dB is observed.

In addition, the embodiments disclosed this time should be thought to be exemplification in all respects and not to be limited. The scope of the present invention is shown not by the above-described explanation of the embodiments but by the scope of claims and further all changes in the scope of claims and in the meaning and scope of uniformity are included.

For example, in the above-described embodiments, the first high resistance 3 and the second high resistance 4 are used as the high impedance of the voltage supply circuit 1, but the present invention is not limited to this. It is acceptable, for example, to use the reverse bias characteristic of diode as the high impedance and it is possible to use an off state of a transistor.

Additionally, in the above-described embodiments, the capacitance measurement apparatus with the circuit configuration shown in FIG. 1, FIG. 3, FIG. 4 and FIG. 5 is explained, but the present invention is not limited to this and similarly applicable to a capacitance measurement apparatus with another circuit configuration.

Additionally, in the above-described embodiments, a case of fixing the electric potential of the signal line 17 that connects the measuring capacitance 14 and the fixed capacitance 15 in the capacitance measurement apparatus is explained, but the present invention is not limited to this and widely applicable to a case of fixing the electric potential of a apparatus other than the capacitance measurement apparatus including a circuit configuration where the first capacitance and the second capacitance are directly connected.

As is described above, by the present invention, in the case of fixing the electric potential of the connection line between the first capacitance and the second capacitance, it is possible to prevent the amount of electric charge of the connection line between the first capacitance and the second capacitance from changing. As a result, for example, in the case of fixing the electric potential of the connection line between the first capacitance and the second capacitance in the capacitance measurement apparatus, the sensibility of the capacitance measurement apparatus does not decrease and therefore it is possible to execute an accurate capacitance measurement.

INDUSTRIAL APPLICABILITY

As is described, the electric potential fixing apparatus, the electric potential fixing method and the capacitance measurement apparatus according to the present invention are useful as a circuit and an apparatus to detect electrostatic capacitance and especially suitable for a detection circuit and a detection apparatus of a capacitive sensor whose value of electrostatic capacitance changes in response to various frequencies such as a capacitor microphone.

What is claimed is:

1. An electric potential fixing apparatus that fixes electric potential of a connection line connecting a first capacitance and a second capacitance connected directly to the first capacitance, the electric potential fixing apparatus comprising a voltage supply unit, having at least two high impedances, operable to maintain constantly electric potential of the connection line, holding a total amount of electric charge of the first capacitance and the second capacitance,
    wherein an output terminal of the voltage supply unit is connected to the connection line.

2. An electric potential fixing apparatus that fixes electric potential of a connection line connecting a first capacitance and a second capacitance connected directly to the first capacitance, the electric potential fixing apparatus comprising a voltage supply unit, having at least two high impedances, operable to output a same electric potential as electric potential of an operation signal applied to the connection line,
    wherein an output terminal of the voltage supply unit is connected to the connection line.

3. The electric potential fixing apparatus according to claim 1 or claim 2,
    wherein the voltage supply unit includes a first high resistance, a second high resistance connected directly to the first high resistance, and a voltage dividing unit that outputs electric potential divided by the first high resistance and the second high resistance.

4. The electric potential fixing apparatus according to claim 1 or claim 2,
    wherein the voltage supply unit includes an amplifier, a predetermined voltage applying unit, a first high resistance, a second high resistance and the output terminal,
    one terminal of the first high resistance is connected to the amplifier,
    another terminal of the first high resistance and one terminal of the second high resistance are connected,
    the output terminal is connected between the other terminal of the first high resistance and the one terminal of the second high resistance, and
    another terminal of the second high resistance and the predetermined voltage applying unit are connected.

5. A capacitance measurement apparatus comprising the electric potential fixing apparatus according to claim 1 or claim 2,
    wherein the electric potential fixing apparatus further includes a first operational amplifier,
    the first capacitance is a measuring capacitance,
    the connection line between the two capacitances is a signal line and
    an input terminal of the first operational amplifier is connected to the signal line.

6. The capacitance measurement apparatus according to claim 5,
    wherein the electric potential fixing apparatus further includes a second operation amplifier and
    an output terminal of the second operational amplifier is connected to the second capacitance.

7. An electric potential fixing method for fixing electric potential of a connection line between two capacitances, a first capacitance and a second capacitance connected directly to the first capacitance,
    wherein with electric potential divided using at least two high impedances as output electric potential, the output electric potential is applied to the connection line between the two capacitances and the output electric potential is fixed at output potential at which there is no input and output of electric current to and from the connection line.

8. An electric potential fixing method for fixing electric potential of a connection line between a first capacitance and a second capacitance connected directly to the first capacitance, wherein with electric potential divided using at least two high impedances as output electric potential, the output electric potential is applied to a connection line between the two capacitances and the output electric potential is set up to be equal to electric potential of an operation signal applied to a connection line between the two capacitances.

9. The electric potential fixing method according to claim 7 or claim 8, wherein either the first capacitance or the second capacitance is used as a measuring capacitance.

* * * * *